(12) United States Patent
Dini et al.

(10) Patent No.: US 11,236,419 B2
(45) Date of Patent: Feb. 1, 2022

(54) MULTILAYER STACK FOR THE GROWTH OF CARBON NANOTUBES BY CHEMICAL VAPOR DEPOSITION

(71) Applicant: COMMISSARIAT A L'ENERGIE ATOMIQUE ET AUX ENERGIES ALTERNATIVES, Paris (FR)

(72) Inventors: Yoann Dini, Grenoble (FR); Jean Dijon, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 69 days.

(21) Appl. No.: 16/588,848

(22) Filed: Sep. 30, 2019

(65) Prior Publication Data

US 2020/0102647 A1    Apr. 2, 2020

(30) Foreign Application Priority Data

Oct. 1, 2018 (FR) ..................................... 1859070

(51) Int. Cl.
*C23C 16/26* (2006.01)
*C23C 16/40* (2006.01)
(Continued)

(52) U.S. Cl.
CPC ............ *C23C 16/26* (2013.01); *C01B 32/158* (2017.08); *C01B 32/16* (2017.08); *C23C 16/402* (2013.01);
(Continued)

(58) Field of Classification Search
CPC ....... C01B 32/16; C01B 32/162; C23C 16/26; C23C 16/45525–45555; C23C 16/401; C23C 16/402
See application file for complete search history.

(56) References Cited

U.S. PATENT DOCUMENTS

2003/0235961 A1*  12/2003  Metzner ............ H01L 21/31612
                                                    438/287
2006/0239894 A1*  10/2006  Kurachi ................ C01B 32/162
                                                    423/445 R
(Continued)

FOREIGN PATENT DOCUMENTS

WO    WO 2013/163493 A1    10/2013

OTHER PUBLICATIONS

Chaisitsak, S. et al., "Hot filament enhanced CVD synthesis of carbon nantubes by using a carbon filament", Diamond and Related Materials 13 (2004), 438-444.
(Continued)

*Primary Examiner* — Z. Jim Yang
(74) *Attorney, Agent, or Firm* — Arent Fox LLP (57) ABSTRACT

The subject of the invention is the use, as catalyst support sublayer in a process for growing carbon nanotubes by chemical vapour deposition (CVD), of a multilayer stack formed of alternating layers of silica and of alumina, each of the layers having a thickness of less than or equal to 10 nm and consisting of one or more superposed atomic monolayer(s). It also relates to a multilayer structure comprising a substrate which has, on at least one of its faces, such a multilayer stack, and also to the use thereof for the growth of a mat of carbon nanotubes, which are in particular spinnable, by chemical vapour deposition, preferably hot-filament chemical vapour deposition.

25 Claims, 4 Drawing Sheets

(51) Int. Cl.
*C23C 16/455* (2006.01)
*C01B 32/158* (2017.01)
*C01B 32/16* (2017.01)

(52) U.S. Cl.
CPC ...... *C23C 16/403* (2013.01); *C23C 16/45529* (2013.01)

(56) References Cited

U.S. PATENT DOCUMENTS

| | | | |
|---|---|---|---|
| 2007/0154623 A1 | 7/2007 | Min et al. | |
| 2010/0024732 A1* | 2/2010 | Mokhlesi | C23C 16/45536 118/724 |
| 2010/0075137 A1* | 3/2010 | Sinton | B01J 23/20 428/328 |
| 2012/0282489 A1* | 11/2012 | Shin | B82Y 30/00 428/688 |
| 2013/0330936 A1* | 12/2013 | Lachaud | H01L 21/0226 438/787 |
| 2014/0313636 A1* | 10/2014 | Tour | H01G 11/36 361/502 |
| 2015/0098891 A1* | 4/2015 | Song | C01B 32/194 423/448 |
| 2015/0132872 A1* | 5/2015 | Bauer | H01L 51/5237 438/26 |
| 2015/0137414 A1* | 5/2015 | Shanov | B01J 37/16 264/176.1 |
| 2016/0115031 A1* | 4/2016 | Okuno | C23C 16/0272 429/231.5 |
| 2016/0282509 A1* | 9/2016 | Perkins | C23C 18/165 |
| 2017/0121177 A1* | 5/2017 | Silva | C01B 32/16 |
| 2019/0127853 A1* | 5/2019 | Pudas | C23C 28/04 |
| 2019/0284686 A1* | 9/2019 | Melnik | C23C 16/34 |
| 2019/0348273 A1* | 11/2019 | Tang | H01L 21/02145 |
| 2020/0240011 A1* | 7/2020 | Kauppinen | B32B 18/00 |

OTHER PUBLICATIONS

Di, J. et al., "Ultrastrong, Foldable, and Highly Conductive Carbon Nanotube Film", ACS Nano 6 (2012) 5457-5464.

Han, B. et al., "The electrical properties of dielectric stacks of SIO and AIO prepared by atomic layer deposition method", Current Applied Physics, North-Holland, Amsterdam, NL, vol. 12, No. 2, pp. 434-436; XP028110369, ISSN: 1567-1739 (Jul. 29, 2011).

Liu, K. et al., "Fabrication and processing of high-strength densely packed carbon nanotube yarns without solution processes", Nanoscale. 4 (2012) 3389.

Quinton, B. et al., "Influence of oxide buffer layers on the growth of carbon nanotube arrays on carbon substrates", Carbon, Elsevier, Oxford, GB, vol. 87, pp. 175-185; XP029204860, ISSN: 0008-6223 (Feb. 7, 2015).

Van de Loo, B. et al., "'Zero-charge' SiO2/ AI2O3 stacks for the simultaneous passivation of n+ and p+ doped silicon surfaces by atomic layer deposition", Solar Energy Materials and Solar Cells, vol. 143, pp. 450-456; XP055500125, ISSN: 0927-0248 (Dec. 1, 2015).

Zhang, M. et al., "Strong, Transparent, Multifunctional, Carbon Nanotube Sheets", Science. 309 (2005) 1215-1219.

* cited by examiner

MULTILAYER STACK FOR THE GROWTH OF CARBON NANOTUBES BY CHEMICAL VAPOR DEPOSITION

CROSS REFERENCE TO RELATED APPLICATION

This application claims priority of French Patent Application No. 1859070, filed Oct. 1, 2018, the contents of which are hereby incorporated by reference in its entirety.

The present invention relates to a novel method for preparing, by chemical vapour deposition (CVD), a mat of carbon nanotubes, which are advantageously spinnable, having excellent electrical properties. It relates more particularly to the use of a novel catalyst support sublayer for the growth of carbon nanotubes by CVD.

Mats of carbon nanotube (CNTs), termed "spinnable", have a particularly advantageous application in the production of 2D films (also called "sheets") and wires (or cables) made of carbon nanotubes [1]. The sheets are of value for optical and optoelectronic applications, for example in the preparation of conductive transparent electrodes. The good electrical, mechanical and thermal properties of carbon-nanotube-based cables make them materials of choice for replacing metals in certain applicative fields, such as in aeronautics and aerospace.

Carbon nanotube mats are typically prepared by a chemical vapour deposition (CVD) technique. The principle of the method for growing CNTs by CVD consists in injecting, into a high-temperature furnace, a carbon-based gas, which is a precursor of the carbon nanotubes, generally acetylene or ethylene, on an iron catalyst previously deposited on a sublayer supported by a base substrate. At high temperature, the thin layer of iron, of nanometric thickness, dewets to form nanoparticles. On contact with an iron nanoparticle, the hydrocarbon cracks to form a carbon nanotube on top of the iron nanoparticle. Carbon nanotubes thus grow vertically and become arranged together in the form of a "forest", also called "mat", of carbon nanotubes. More than 10 billion nanotubes can thus be formed per $cm^2$ of sample.

In certain rare cases, the nanotube mats are arranged in such a way that, by pulling on one side of the mat, the carbon nanotubes can unwind to form a 2D sheet of carbon nanotubes. This sheet can be used as it is, or else in a twisted form, to form a cable. The capacity of a carbon nanotube mat to form a sheet is called "spinnability". This is sensitive to several parameters, such as the nature of the sublayer on which the catalyst is deposited, the thickness of the catalytic layer, the temperature or else the nature of the gas phase during the CVD process.

Already proposed as sublayers, supporting the catalyst for the growth of organized nanotubes in the form of spinnable mats are, on the one hand, a sublayer of alumina [2] and, on the other hand, a sublayer of silica [3]. Unfortunately, each of the methods proposed has drawbacks.

Thus, the electrical performance of cables produced with CNT mats obtained from an alumina sublayer are lower than those obtained for CNT mats produced from a silica sublayer. The maximum conductivity, listed in the literature, for alumina is 600 S/cm, whereas it is 1000 S/cm for silica. Likewise, the CVD growth of nanotubes from an alumina sublayer is carried out at a temperature of 750° C., whereas that carried out from a silica sublayer can advantageously be obtained at lower temperatures (660° C.).

On the other hand, the use of an alumina sublayer for the preparation of CNT mats has the advantage of producing nanotubes with smaller diameters. Typically, the diameter of carbon nanotubes making it possible to obtain spinnable mats is about 8.5 nm for growth carried out from an alumina sublayer, whereas it is approximately 16 nm in the context of the use of a silica sublayer. Moreover, it is known that, for multi-walled carbon nanotubes, the resistance of the nanotube, when it is contacted by the sidewall, as in the case of the preparation of a sheet or a cable of nanotubes, is independent of its diameter [4]. In order to have a cable with the lowest possible resistance, it is therefore necessary to place a maximum number of carbon nanotubes in parallel per unit of cross section. This is possible by having carbon nanotubes which have the smallest possible diameter.

Thus, it would be desirable to have a method for preparing a mat of carbon nanotubes, which are advantageously spinnable, making it possible to combine the advantages specific to each of the methods already proposed for the growth of mats of spinnable CNTs.

More particularly, there remains a need to have a method for preparing carbon nanotubes making it possible to obtain, at low temperatures, mats of spinnable carbon nanotubes, composed of nanotubes of small diameters, while at the same time having optimal electrical properties.

It is precisely the aim of the present invention to satisfy the abovementioned requirements.

More specifically, the inventors have noted that it is possible to obtain a mat of carbon nanotubes, corresponding to the abovementioned criteria, by using, as sublayer supporting the catalyst of the growth of carbon nanotubes by CVD, a multilayer stack formed of an alternating succession of atomic layers of two different oxides, alumina and silica.

According to a first of its aspects, the present invention thus relates to the use, as catalyst support sublayer in a process for growing carbon nanotubes by chemical vapour deposition (CVD), of a multilayer stack formed of alternating layers of silica and of alumina, each of the layers having a thickness of less than or equal to 10 nm and consisting of one or more superposed atomic monolayers.

As detailed in the remainder of the text, the multilayer stack according to the invention can be supported, conventionally, by a base support, and coated on its face opposite the substrate with a layer of carbon nanotube growth catalyst material(s), termed "catalytic layer", for example a layer of iron.

Thus, the invention also relates to a multilayer structure comprising a substrate which has, on at least one of its faces, a multilayer stack as defined above, and more particularly which is coated on its face opposite the substrate with a catalytic layer.

As illustrated in the examples which follow, the use of such a multilayer structure makes it possible to result, by a chemical vapour deposition technique, preferably activated by hot filaments, in the formation of a mat of carbon nanotubes, advantageously a mat of spinnable carbon nanotubes, having excellent electrical conductivity properties.

Thus, according to another of its aspects, the invention relates to a process for growth of a mat of carbon nanotubes, preferably of a mat of spinnable carbon nanotubes, comprising at least the steps consisting in:

(i) having a substrate which has, on at least one of its faces, a multilayer stack formed of alternating layers of silica and of alumina, as defined above, said multilayer stack being surface-coated with a catalytic layer; and (ii) performing the growth, at the surface of the catalytic layer, of a mat of carbon nanotubes, according to a chemical vapour deposition (CVD), preferably hot-filament chemical vapour deposition, technique.

It also relates to an assembly, as obtained at the end of the abovementioned CVD growth process, comprising a multilayer structure as defined above, coated with a mat of carbon nanotubes.

For the purposes of the invention, the term "mat of carbon nanotubes" is intended to denote a layer of carbon nanotubes, substantially parallel to one another, oriented perpendicular to the multilayer structure according to the invention, and the thickness of which is close to the unit length of the nanotubes.

A mat according to the invention of carbon nanotubes, denoted "CNTs" in the remainder of the text, has more particularly a high density of carbon nanotubes, in particular a density of greater than or equal to $10^{10}$ nanotubes per $cm^2$ and more particularly of between $10^{10}$ and $10^{13}$ nanotubes per $cm^2$.

The term mat of "spinnable" carbon nanotubes is intended to denote the ability of the mat of nanotubes to be deformed to form a 2D sheet, and subsequently, a cable, of carbon nanotubes. The term "spinnability" of the CNT mat is also used.

Advantageously, a carbon nanotube mat obtained according to the invention has excellent electrical conductivity properties. Thus, the conductivity of the cables manufactured from the CNT mats produced according to the invention is advantageously greater than or equal to 600 S/cm, in particular approximately 926 S/cm.

Likewise, the carbon nanotubes obtained according to the invention advantageously have small diameters, in particular a mean diameter of less than or equal to 13 nm, preferably less than or equal to 8 nm.

Thus, advantageously, the use of a multilayer stack according to the invention, as support sublayer for the catalyst for the growth of carbon nanotubes by CVD, makes it possible to obtain a CNT mat combining both good spinnability properties and very good electrical performance levels.

Furthermore, advantageously, as illustrated in the examples which follow, it is possible, via the use of a hot-filament CVD technique, preferably using a grid of hot carbon filaments, to synthesize such a mat of spinnable CNTs, under low-temperature conditions, in particular lowered to 630° C., and therefore advantageously lower than the temperatures used for the processes, proposed up until now, that are typically greater than 660° C., and on average greater than 730° C.

According to one particularly advantageous implementation variant, the growth of the CNTs from a multilayer according to the invention is carried out by means of a hot-filament CVD technique, under low-pressure, in particular less than or equal to 10 mbar, and low-temperature, in particular less than or equal to 650° C., conditions.

Finally, advantageously, as detailed in the remainder of the text, the inventors have shown that it is possible to adjust the CNT growth parameters during the hot-filament CVD process, by varying, during the CNT growth, the supply of carbon at the surface of the catalyst and/or the power of the filament(s).

The invention may be understood more clearly on reading the detailed description that will follow, given in reference to the appended drawings in which.

Figure 1:
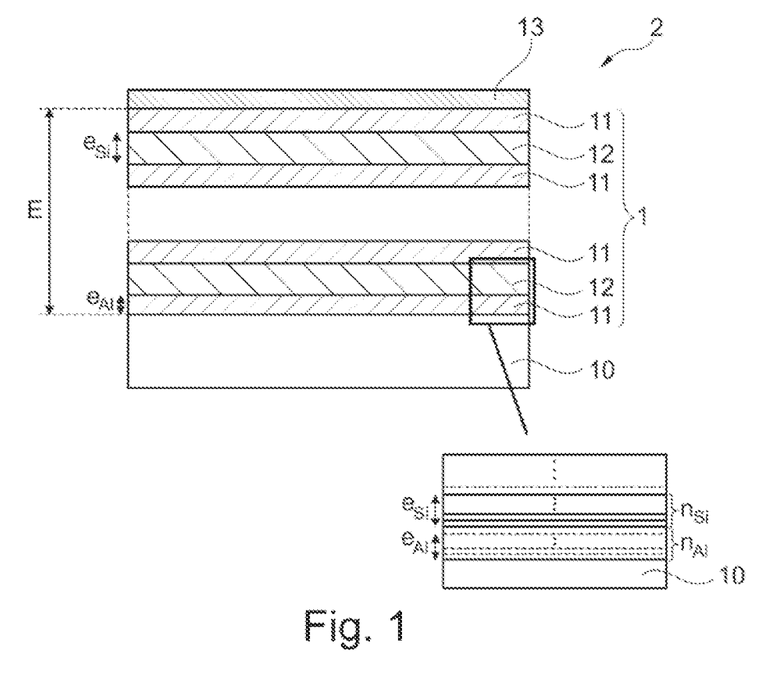
FIG. 1 represents, schematically and in transverse section, a substrate (10) coated with a multilayer stack (1) according to the invention, formed of alternating layers of silica (12) and of alumina (11), and supporting a layer (13) that is catalytic for the CNT growth. The zoom of a part of the multilayer stack (1) represents, schematically, the constitution of each of the layers of silica and alumina, formed respectively of one or more atomic monolayers.
Figure 2:
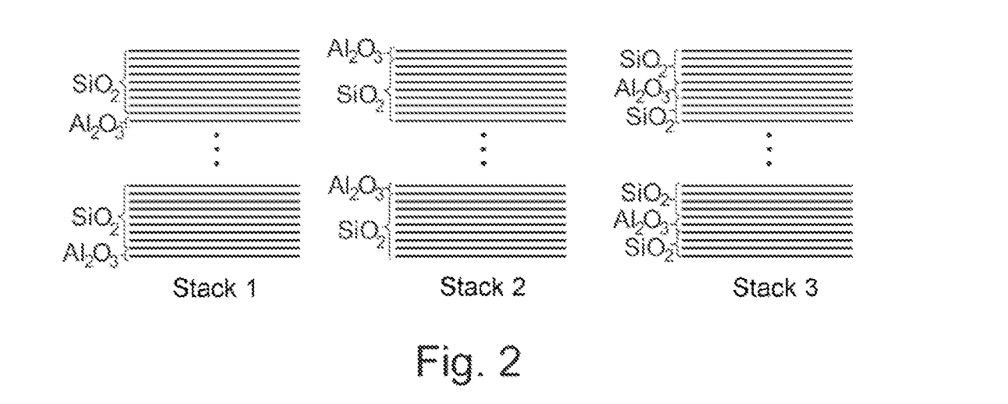
FIG. 2 represents, schematically and in transverse section, the three variants of multilayer stack according to the invention, formed of alternating layers of silica ($SiO_2$) and of alumina ($Al_2O_3$), tested in the examples.
Figure 4:
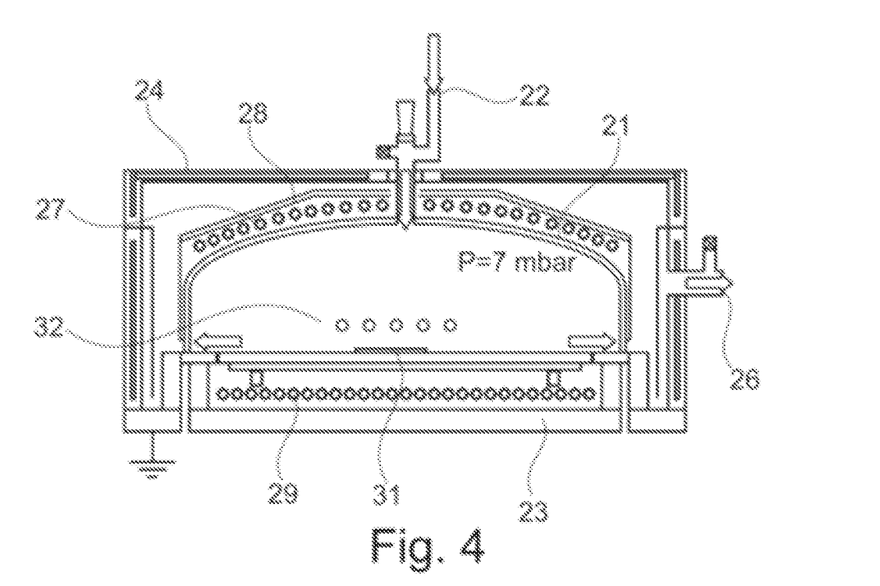
FIG. 4 represents, schematically and partially, an experimental reactor, as used in the examples, for the growth by CVD using a grid (32) of hot filaments.

It should be noted that, for reasons of clarity, the various elements in FIGS. 1, 2 and 4 are represented on a free scale, the actual dimensions of the various parts not being respected.

In the remainder of the text, the expressions "between . . . and . . . ", "ranging from . . . to . . . " and "varying from . . . to . . . " are equivalent and are intended to mean that the limits are included, unless otherwise mentioned.

Unless otherwise mentioned, the expression "comprising a" should be understood as "comprising at least one".

Multilayer Stack According to the Invention

As mentioned above, the invention uses, as sublayer supporting the catalyst for carbon nanotube growth by CVD, a multilayer stack formed of alternating layers of silica ($SiO_2$) and of alumina ($Al_2O_3$).

Implementation variants of a multilayer stack according to the invention are represented, schematically, in the following FIGS. 1 and 2.

Each of the layers of silica (respectively, of alumina) of the multilayer stack according to the invention is itself formed of one or more atomic monolayer(s) of silica (respectively, of alumina).

A multilayer stack according to the invention may comprise a number of layers of silica, denoted $N_{Si}$, ranging from 1 to 500, each of the layers of silica itself being formed of one or more atomic monolayers of silica.

Likewise, it may comprise a number of layers of alumina, denoted $N_{Al}$, ranging from 1 to 500, each of the layers of alumina itself being formed of one or more atomic monolayers of alumina.

Since the stack according to the invention is formed of an alternating succession of layers of alumina and of silica, it is understood that $N_{Si}=N_{Al}$, $N_{Si}=N_{Al}-1$ or $N_{Si}=N_{Al}+1$.

Preferably, the layers of silica, formed of one or more atomic monolayers of silica, have, independently of one another, a thickness (denoted $e_{Si}$) of between 0.01 and 10 nm, in particular between 0.1 and 10 nm and more particularly between 0.1 and 2 nm.

Likewise, the layers of alumina (12), formed of one or more atomic monolayers of alumina, have, independently of one another, a thickness (denoted $e_A$) of between 0.01 and 10 nm, in particular between 0.1 and 10 nm and more particularly between 0.1 and 2 nm.

The total number of layers of silica and alumina forming a multilayer stack according to the invention is more particularly adjusted with regard to the desired thickness for the multilayer stack according to the invention.

The total number of layers of a multilayer stack is of at least three, in particular of at least ten, even of at least fifteen.

A multilayer stack according to the invention, formed of the succession of the superposed layers of silica and of alumina, preferably has a total thickness, denoted E, of between 5 nm and 50 nm, in particular between 7 nm and 20 nm, and more particularly between 8 nm and 12 nm.

The layers of silica of a multilayer stack according to the invention can be formed, independently of one another, of a number (denoted $n_{Si}$) of atomic monolayer(s) of silica of between 1 and 500, in particular between 10 and 500.

Likewise, the layers of alumina of a multilayer stack according to the invention can be formed, independently of one another, of a number (denoted $n_{Al}$) of atomic monolayer(s) of alumina of between 1 and 500, in particular between 10 and 500.

By way of example, the layers of silica of the multilayer stacks 1 and 2, represented schematically in FIG. 2, each have nine unit atomic layers of silica, whereas the layers of alumina are formed of a single unit atomic layer of alumina.

The expression "independently of one another" is intended to mean that the number of atomic layers of silica (respectively of alumina) can differ from one layer of silica (respectively of alumina) to another.

Thus, for example, for the multilayer stack 3 represented schematically in FIG. 2, the layers of silica have, in alternation, four and five unit atomic layers of silica.

The atomic monolayers, also termed "unit layers", of silica and/or of alumina can have a thickness of between 0.01 nm and 0.5 nm, in particular between 0.05 nm and 0.2 nm.

The number of atomic monolayers of silica and of alumina of the alternating layers of silica and of alumina, in a multilayer stack according to the invention, can be more particularly adjusted with regard to the desired proportions of silica and of alumina in the multilayer stack.

According to one particular embodiment, a multilayer stack according to the invention has a silica/alumina mole ratio of between 1 and 99, in particular of between 2 and 50, and more particularly of between 5 and 15.

By way of example, the multilayer stacks, tested in the examples and represented schematically in FIG. 2, have a silica/alumina mole ratio of 9.

As illustrated in the examples which follow, the inventors have discovered that the distribution of the atomic monolayers of silica and of alumina within the multilayer stack according to the invention influences the properties of the nanotubes obtained at the end of the growth by CVD.

In particular, the number of atomic monolayers constituting each of the alternating layers of silica and of alumina, or else the nature of the upper layer, subjacent to the catalytic layer, in a multilayer stack according to the invention, influence the characteristics, in particular in terms of length, of the nanotubes obtained at the end of the growth by CVD.

Thus, advantageously, the distribution of the atomic layers in a multilayer stack according to the invention can be advantageously adjusted so as to control the dimensions of the carbon nanotubes obtained.

Preparation of the $SiO_2/Al_2O_3$ Multilayer Stack

A multilayer stack according to the invention can be prepared by successive deposits of atomic monolayers of silica and of alumina at the surface of a base substrate.

According to yet another of its aspects, the invention thus relates to a multilayer structure comprising a substrate which has, on at least one of its faces, a multilayer stack according to the invention.

It also relates to a process for preparing such a multilayer structure, comprising the depositing, at the surface of a base substrate, of successive atomic monolayers of silica and of alumina.

The process may more particularly comprise the deposition, on the face of the multilayer stack that is opposite the base substrate, of a layer of CNT growth catalyst material(s).

In the context of the invention, the term "substrate" refers to a solid base structure on one of the faces of which the multilayer stack according to the invention is formed.

The base substrate may be of various shapes and natures.

It is understood that the nature of this substrate is chosen for its chemical inertia during the operating conditions of the process for synthesizing CNTs by the CVD technique, as detailed in the remainder of the text. Advantageously, this substrate is inorganic. It may be chosen from silicon, alumina, an active carbon, silica, a silicate, magnesia, titanium oxide, zirconia, a zeolite or else carbon fibres.

For example, it is a silicon wafer.

The preparation of a multilayer stack according to the invention, as defined above, comprises more particularly the following steps:

(i) successively forming $n_{Si}$; atomic monolayers of silica;
(ii) successively forming $n_{Al}$ atomic monolayers of alumina;

steps (i) and (ii) being carried out in this order or in reverse order, and repeated a sufficient number of times to form the desired multilayer stack formed of the alternation of layers of silica and of alumina.

The various successive atomic monolayers of silica and of alumina may be more particularly formed by an atomic layer deposition (ALD) technique.

Those skilled in the art are able to adjust the parameters for implementing the method by ALD in order to carry out the deposition of the desired atomic layers.

Advantageously, the deposition of the layers of silica and of alumina is carried out in a chamber under vacuum.

The substrate during the deposition of the successive layers may be maintained at a temperature of between 100° C. and 400° C.

A cycle of deposition of an atomic layer, "ALD", of metal oxide such as alumina or of metalloid oxide such as silica generally comprises:

exposure of the surface of the substrate, heated beforehand, to a precursor containing the metal or the metalloid of the metal oxide or metalloid oxide to be formed.

In the case of the formation of an atomic monolayer of silica, the precursor will contain silicon; in the case of the formation of an atomic monolayer of alumina, the precursor will contain aluminium. These precursors are generally organometallic compounds of metal or metalloid. The precursors of silica and of alumina are respectively 3-aminopropyl-triethoxysilane (APTES) and trimethylaluminium (TMA).

The duration of the exposure of the surface of the substrate to the precursor must be sufficient to saturate the surface of the substrate with the precursor;

a step of placing under vacuum. During this step, the substrate is maintained under vacuum for a certain period of time, without exposure of the surface of the substrate to the precursor.

This step makes it possible to allow time for the excess precursor molecules to desorb from the surface of the substrate and to be discharged by pumping;

exposure of the surface of the substrate to water.

This step makes it possible to oxidize the precursor molecules in order to form a monolayer of silica oxide ($SiO_2$) or of alumina ($Al_2O_3$);

a step of placing under vacuum. During this step, the substrate and the monolayer of oxide are maintained under vacuum for a certain period of time, without exposure of the surface of the substrate to water. This step makes it possible to discharge the excess water molecules.

This cycle is repeated in order to form the various atomic monolayers of silica and of alumina and to achieve the desired thickness for each of the alternating layers of silica and of alumina of the multilayer stack according to the invention.

Catalytic Layer

As indicated above, the multilayer stack according to the invention serves as a sublayer supporting the carbon nanotube growth catalyst.

Thus, a multilayer structure of use for the growth by CVD of carbon nanotubes, comprises, at the surface of the multilayer stack according to the invention, a layer of CNT growth catalyst material(s), termed catalytic layer.

The carbon nanotube growth catalyst materials are well known to those skilled in the art. They may for example be chosen from iron (Fe), chromium (Cr), nickel (Ni), cobalt (Co) and palladium (Pd), and also from all the binary, ternary and quaternary alloys between these materials.

Preferably, the catalytic layer is a layer of iron.

The deposition of the catalytic layer at the surface of the multilayer stack according to the invention can be carried out by any technique known to those skilled in the art, for example by electron gun evaporation.

The catalytic layer, subjacent to the multilayer stack according to the invention, may have a thickness of between 0.3 nm and 5 nm, in particular between 0.5 nm and 3 nm, and more particularly between 1 and 2 nm.

As represented schematically in FIG. 1, a multilayer structure (2) according to the invention, that is of use for carbon nanotube growth by CVD, can thus comprise, in this order of superposition:

a base substrate (10), for example a silica substrate;

a multilayer stack (1) borne by the substrate, formed of alternating layers of alumina (11) and of silica (12) according to the invention, as detailed above; and a layer (13) borne by the multilayer stack, based on CNT growth catalyst material(s).

The catalyst material is more particularly used, during the process for CNT growth by CVD, in its reduced form. Said reduced form is generally obtained by exposing the catalytic layer within the CVD reactor to hydrogen. In this way, the catalyst material is reduced in situ in the CVD reactor, and the catalytic layer is not oxidized during the use of the multilayer structure for the CNT growth.

CVD Growth Process

The mat of carbon nanotubes is formed by growth of carbon nanotubes by a technique of chemical vapour deposition (CVD) at the surface of a multilayer structure as described above, using, as sublayer subjacent to the catalytic layer, a multilayer stack of alternating layers of silica and of alumina according to the invention.

Thus, according to another of its aspects, the invention also relates to a process for growth of a mat of carbon nanotubes, comprising at least the steps consisting in:

(i) having a substrate which has, on at least one of its faces, a multilayer stack according to the invention formed of alternating layers of silica and of alumina, as described above, said multilayer stack being surface-coated with a catalytic layer; and (ii) performing the growth of a mat of CNTs at the surface of the catalytic layer, according to a technique of chemical vapour deposition, which may or may not be plasma-enhanced, and which is preferably hot-filament chemical vapour deposition.

Chemical vapour deposition (CVD) techniques are techniques well known for CNT growth.

In general, chemical vapor deposition is carried out by placing one or more carbon precursors in the vapour phase, followed by thermal decomposition of the precursors at the surface of the catalyst so as to cause CNTs to grow.

CNT growth can be carried out by a technique of chemical vapour deposition which may or may not be plasma-enhanced.

According to one particular embodiment, the CVD growth process is carried out under low-pressure conditions. More particularly, the pressure within the CVD reactor can be maintained at a value of less than or equal to 10 mbar, in particular less than or equal to 2 mbar and more particularly of between 0.5 and 1.5 mbar.

According to one particularly advantageous implementation variant, the CNT growth is carried out by means of a hot-filament CVD technique (HFCVD for "hot-filament CVD").

It is up to those skilled in the art to adjust the conditions for carrying out the deposition by CVD, in particular by HFCVD, in order to obtain the desired mat of CNTs.

The hot filament(s) may be made of carbon (C), ruthenium (Ru), molybdenum (Mo), tantalum (Ta), rhenium (Re) or tungsten (W). Preferably, the filament(s) is (are) carbon filament(s).

The use of carbon hot filament(s) for the synthesis by CVD of carbon nanotubes has already been described, for example by Chaisitsak et al. [5] and in document US 2006/0185595.

The filament(s) is (are) positioned in proximity to the surface of the catalytic layer. They act both as a heat source for the decomposition of the carbon-based precursor gas, and can also serve to heat the substrate.

Typically, the hot filament(s) is (are) positioned parallel to the plane formed by the surface of the catalytic layer, at a distance of between 5 and 20 mm from the surface. The filaments can typically have a length ranging from 5 to 25 cm and a diameter of between 0.3 and 1 mm.

Preferably, several filaments are used. They can advantageously be arranged parallel to one another, in the form of a grid, preferably equidistant from one another. Such a grid of hot filaments may for example be as described in document US 2006/0185595. It is up to those skilled in the art to optimize, with regard to the diameter of the filaments used, the number of filaments and the spacing between the filaments and the distance between the filaments and the catalytic surface.

Figure 5:
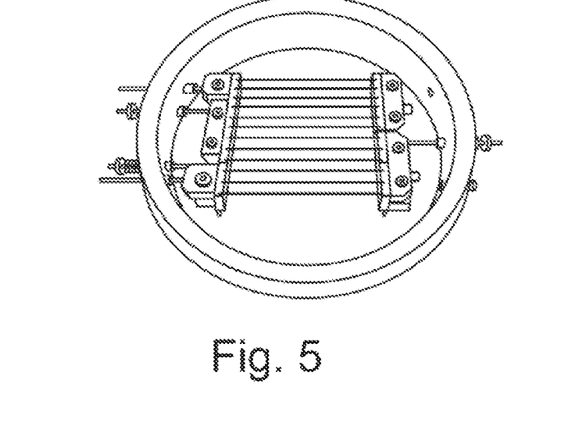
FIG. 5 is an image of a grid of carbon filaments used for the growth by CVD.

FIG. 5 is a photograph of the grid of twelve carbon filaments used in the process for CNT growth by HF-CVD in the examples which follow.

The carbon filament power applied can be between 100 and 2000 W, in particular between 400 and 1000 W. At this power, the temperature of the carbon filaments is more particularly between 1000 and 2500° C., in particular between 1500° C. and 2000° C.

The CNT growth can be carried out in any reactor suitable for chemical vapour deposition. By way of example, FIG. 4 is a scheme in transverse section of a deposition chamber making it possible to carry out the process according to the invention.

This chamber allows the production of a secondary vacuum. In this chamber, a quartz bell jar (21) makes it possible to limit the reaction zone where the plasma is produced. This bell jar (21) allows the introduction of gas via a gas inlet (22). The bell jar rests on a floor (23) electrically insulated from the frame (24). A gas outlet (26) makes it possible to pump the interior of the frame (24). A first heating device (27) is placed above the bell jar (21) and under a heat reflector (28). A second heating device (29), placed in the bottom position, makes it possible to heat the floor above which the sample (31) rests.

A grid of hot filaments (32) can be positioned above the surface of the catalytic layer of the sample.

The carbon is provided by virtue of a carbon-rich precursor gas, conventionally methane, ethane or an alkene, in particular ethylene or acetylene. Preferably, the carbon-based precursor is acetylene.

The chamber can be placed in an atmosphere formed of one or more gases, typically hydrogen as a mixture with one or more neutral gases such as nitrogen, argon or helium. The carbon-based gas phase can for example be a mixture of acetylene, hydrogen and helium.

Of course, the device for deposition by CVD can comprise, conventionally, means, not represented in FIG. 4, for controlling the flow rate for feeding the chamber.

The gas stream of carbon-based precursor can be used with a flow rate of greater than or equal to 1 $cm^3$/min (sccm), in particular of between 20 and 40 $cm^3$/min (sccm).

The use of hot filament(s) advantageously makes it possible to carry out a synthesis of carbon nanotubes by CVD at temperatures lower than those normally used in CVD processes.

Advantageously, the process for CNT growth by CVD according to the invention can be carried out under temperature conditions of strictly less than 660° C., in particular less than or equal to 650° C., and more particularly less than or equal to 640° C. and in particular approximately 630° C.

In particular, the inventors have noted that it is possible, by virtue of the use of hot filament(s), preferably made of carbon, to obtain a mat of CNTs, having the desired dimensions, in terms of diameter and height, which are advantageously spinnable, under temperature conditions not exceeding 650° C., this being while controlling the parameters during the growth by CVD, as detailed in the remainder of the text.

It is thus possible to obtain mats of spinnable CNTs under temperature conditions lower than those used in the CNT formation processes known from the literature, discussed above, which are carried out using a catalyst support sublayer, of silica or alumina type.

Thus, according to one particularly advantageous implement variant, the growth of CNTs by hot-filament CVD is carried out under pressure conditions of less than or equal to 1.5 mbar and temperature conditions of less than or equal to 650° C., in particular less than or equal to 640° C.

More particularly, the growth of the CNTs by hot-filament CVD is carried out by varying, during the growth of the CNTs, the provision of carbon at the surface of the catalyst.

The adjustment of the provision of carbon at the surface of the catalyst can be carried out by varying the gas flow rate of carbon-based precursors.

More particularly, the gas flow rate of carbon, typically of between 20 and 40 $cm^3$/min (sccm), can be increased, during the CNT growth, by at least 20%, in particular about 20% to 40%, relative to its initial value at the beginning of the CNT growth.

The control of the provision of carbon at the surface of the catalyst advantageously allows an adjustment of the growth parameters, despite the temperature drift induced by the provision of power of the hot filament(s).

Moreover, the CNT growth by hot-filament CVD is advantageously carried out by varying the power of the filament(s) during the CNT growth.

More particularly, the power of the filament(s) is adjusted so as to be higher at the beginning of the CNT growth phase than subsequently.

For example, the power can be lowered a few minutes after the beginning of the CVD process, in particular can be reduced by 10% to 20% relative to its initial value at the beginning of the CVD process.

Such an adjustment of the power of the filament(s) advantageously makes it possible to limit the temperature drift and to obtain rapid nucleation of the mat.

Thus, according to one particularly advantageous implementation variant, the growth of the CNT mat by a hot-filament CVD process is carried out by varying, during the growth by CVD, both the provision of carbon at the surface of the catalyst and the power of the hot filament(s).

The duration of CNT growth can be between 10 and 60 minutes, in particular between 20 and 50 minutes.

Of course, the invention is in no way limited to the implementation of a deposition by hot-filament CVD under the low-pressure and low-temperature conditions described above. Other variants for the growth by CVD of carbon nanotubes at the surface of a multilayer structure according to the invention can be implemented.

For example, the CNT growth can be carried out according to other conventional techniques for growth by CVD, such as for example according to processes carried out in furnaces at atmospheric pressure.

CNT Mat and Applications

The assembly obtained at the end of the formation of the CNT mat comprises more particularly the following stack, in this order:

base substrate as defined above;

multilayer stack according to the invention formed of alternating layers of silica and of alumina;

layer of carbon nanotube growth catalyst material(s), preferably made of iron; and CNT mat.

The nanotubes of a CNT mat obtained according to the invention can be more particularly obtained in the form of a single wall, also called SWNTs (for Single Wall Carbon Nanotubes) and/or of multi-walls, also called MWNTs (for Multi Wall Carbon Nanotubes).

A CNT mat obtained according to the invention comprises in particular carbon nanotubes having a mean unit diameter of between 4 and 10 nm, preferably less than or equal to 8 nm, and more particularly less than or equal to 7 nm.

The diameter of the CNTs can be estimated by transmission electron microscopy.

Advantageously, the mats of CNTs formed according to the invention have good spinnability properties. In particular, the CNTs have heights suitable for the spinning of the mats obtained. The length of the carbon nanotubes of a CNT mat according to the invention can be greater than or equal to 100 µm, in particular between 100 and 600 µm, in particular between 100 and 400 µm and more particularly between 150 and 300 µm.

A CNT mat formed according to the invention can advantageously have a CNT density of greater than or equal to $10^{10}$, in particular of between $10^{10}$ and $10^{11}$ CNTs per $cm^2$.

As indicated above, the process of the invention advantageously makes it possible to obtain a mat of carbon nanotubes, which are advantageously spinnable, having good electrical performance levels.

The electrical performance levels of a CNT mat can be assessed with regard to the electrical conductivity of the cables manufactured from the CNT mat.

Thus, the conductivity of the cables manufactured from a carbon nanotube mat produced according to the invention is advantageously greater than or equal to 600 S/cm, in particular greater than or equal to 900 S/cm, and in particular approximately 926 S/cm.

The mats of carbon nanotubes, which are in particular spinnable, obtained according to the invention, having good electrical properties, have particularly advantageous applications, in particular used in the form of 2D films (sheets) or of cables.

The carbon nanotube-based cables can be used for applications in aeronautics and aerospace.

Because of their excellent mechanical and electrical properties, the carbon nanotubes can also be used in the manufacture of pressure sensors and gas sensors.

Finally, the carbon nanotube sheets have numerous applications for the production of conductive transparent electrodes which are included in display devices (OLED, touchscreens, flexible screens, etc.) and photovoltaic devices, for example in solar cells. They can also be used in the preparation of various electronic or optoelectronic devices.

The invention will now be described by means of the following examples, given of course by way of nonlimiting illustration of the invention.

EXAMPLE

Preparation of the Sublayers

The samples are prepared from a silicon wafer, on which a specific multilayer stack according to the invention is formed via an atomic thin layer deposition (ALD) process.

A layer of iron catalyst with a thickness of 1.5 nm is subsequently deposited at the surface of the stack by electron gun evaporation.

The multilayer stacks tested are composed of 10 mol % of alumina and 90 mol % of silica. The total thickness (E) of each of the multilayer stacks is 10 nm. A monolayer of silica or of alumina has a thickness of approximately 0.1 nm. The stack obtained with a thickness of 10 nm consists of approximately 100 atomic monolayers with 90 atomic monolayers of silica and 10 atomic monolayers of alumina.

While preserving these proportions of silica and of alumina, three multilayer stacks, having different distributions of atomic monolayers of silica and of alumina, were prepared, as represented schematically in FIG. 2.

Stack 1: alternation of an atomic monolayer of alumina ($Al_2O_3$) and of nine atomic monolayers of silica ($SiO_2$), the upper layer being a layer of silica;

Stack 2: alternation of nine atomic monolayers of silica ($SiO_2$) and of an atomic monolayer of alumina ($Al_2O_3$), the upper sublayer being a layer of alumina; and Stack 3: repetition of the following sequence: four atomic monolayers of silica/one atomic monolayer of alumina/five atomic monolayers of silica, the upper layer being a layer of alumina.

Process for Growth of Carbon Nanotubes by Hot-Filament CPCVD

The growth of the carbon nanotube mats is carried out in a hot-filament CVD reactor, as represented in the following FIG. 4, according to the following successive steps.

First of all, after installation of the samples in the reactor, the vacuum is produced to a pressure of $5 \times 10^{-6}$ Torr.

Next, under a stream of 100 sccm of hydrogen at 0.15 Torr, the furnace temperature is raised to 460° C. over the course of 10 minutes.

The furnace temperature is then maintained at 460° C., then the gas phase is changed to 25 sccm of acetylene, 50 sccm of hydrogen and 105 sccm of helium at 0.9 Torr.

Simultaneously with the change in the gases, a "racket" formed of six carbon filaments (10 cm in length and 0.4 or 0.5 mm in diameter), installed in parallel, and positioned 1 cm above the sample, is switched on, with a power of 700 W for 2 minutes and then of 600 W for the subsequent 18 minutes.

The gas phase is then enriched with carbon with 30 sccm of acetylene, 50 sccm of hydrogen and 100 sccm of helium at 0.9 Torr for the subsequent 20 minutes. The furnace setpoint temperature and the filament power remain unchanged.

The filament power is then turned off, as is the heating of the furnace; the gas phase is then only formed of helium at 0.45 Torr with a flow rate of 100 sccm.

Figure 6:
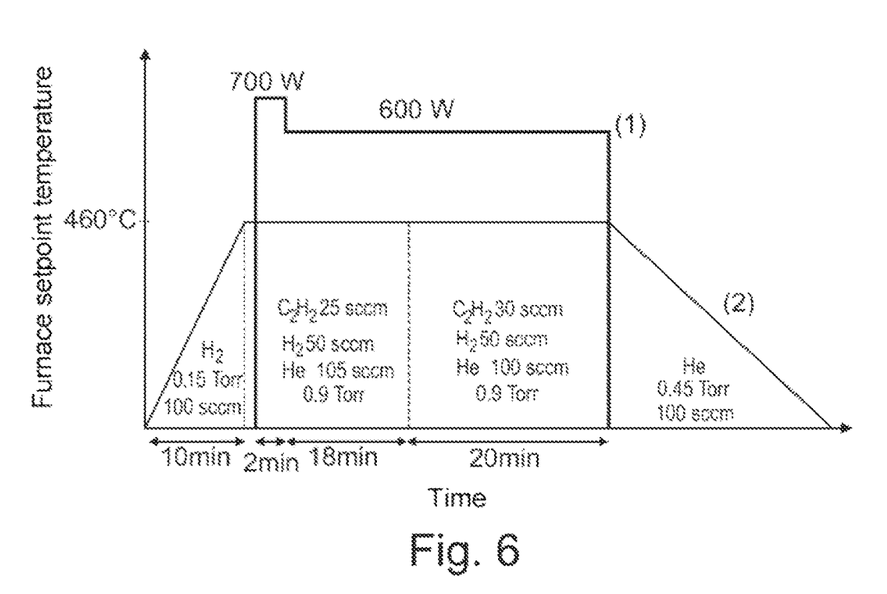
FIG. 6 is the timing diagram of the CNT growth process carried out as examples, with (1) the power of the hot filaments and (2) the temperature of the floor of the reactor on which the samples rest.

The timing diagram of the parameters of the CNT growth process is represented in FIG. 6, with (1) the power of the hot filaments and (2) the temperature of the floor of the reactor on which the samples rest.

Results

The three stacks, used as support sublayer for the iron catalyst in the process for growth of CNTs by HF-CVD, resulted in the formation of mats having spinnability properties.

Figure 3:
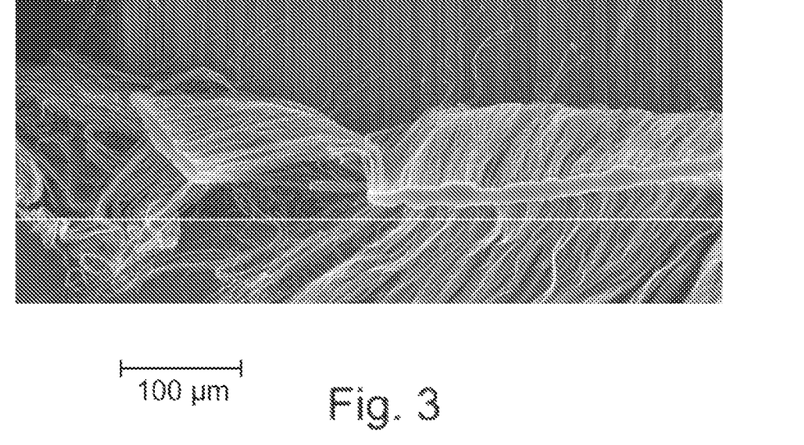
FIG. 3 is a Photostat of a spinnable CNT mat obtained by scanning electron microscopy (SEM) according to the invention.

FIG. 3 presents a photograph obtained by scanning electron microscopy (SEM) of one of the CNT mats obtained with stack 1.

The CNT growth kinetics are different depending on the sublayers used. Thus, with an identical growth process for 40 minutes, as described above, the carbon nanotubes obtained have a mean length of 185 µm with stack 1, of 250 µm with stack 2 and of 290 µm with stack 3.

Figure 7:
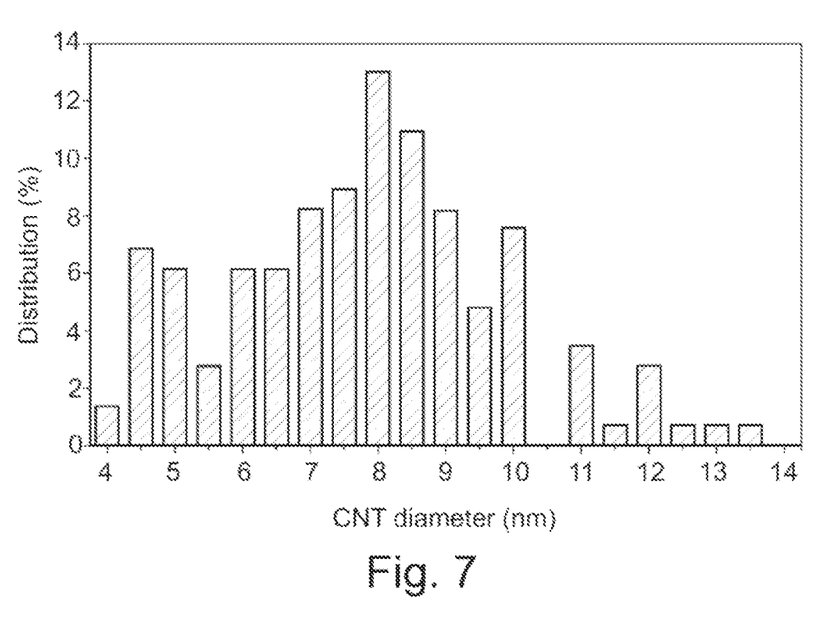
FIG. 7 is a histogram of the distribution of the diameter of the CNTs of the mats obtained using the first multilayer stack variant tested in the examples.

The mean diameter of the nanotubes is 7 nm. The distribution of the diameters of the CNTs obtained with the three sublayers tested is represented in FIG. 7.

It is thus possible, by adjusting the number and the distribution of the atomic monolayers of silica and of alumina within a multilayer stack according to the invention, to control the growth parameters and the dimensions of the carbon nanotubes obtained.

The cables prepared from the CNT mats obtained have an electrical conductivity of 926 S/cm. The carbon nanotube cable is manufactured from a "spinnable" carbon nanotube mat. This mat unwinds into a sheet that is then twisted and wound onto a spool. The measurements of electrical conductivity of this cable are carried out with the four-point method. The diameter of the cable, measured with an optical microscope, is approximately 10 µm.

REFERENCES

[1] Zhang et al., Science. 309 (2005) 1215-1219;
[2] Di et al., ACS Nano. 6 (2012) 5457-5464;

[3] Liu et al., Nanoscale. 4 (2012) 3389;
[4] Todri-Sanial et al., Carbon Nanotubes for Inter connects: Process, Design and Applications, Springer International Publishing, 2017;
[5] Chaisitsak et al., Diamond and Related Materials 13 (2004), 438-444.

The invention claimed is:

1. A multilayer structure comprising a substrate which has, on at least a first face of the substrate, a multilayer stack,
wherein the multilayer stack comprises alternating layers of silica and alumina,
wherein each of the alternating layers has a thickness of less than or equal to 10 nm,
wherein each of the alternating layers consists of superposed atomic monolayer(s), and
wherein an outer layer of the alternating layers of silica and alumina is made of silica or alumina, and
wherein the outer layer defines a second face of the multilayer stack and has directly deposited thereupon a layer of carbon nanotube growth catalyst material(s).

2. The multilayer structure according to claim 1, wherein said catalytic layer comprises iron.

3. The multilayer structure according to claim 1, wherein said layers of silica each have a thickness of between 0.01 and 10 nm.

4. The multilayer structure according to claim 1, wherein said layers of silica each have a thickness of between 0.1 and 2 nm.

5. The multilayer structure according to claim 1, wherein said layers of alumina each have a thickness of between 0.01 and 10 nm.

6. The multilayer structure according to claim 1, wherein said layers of alumina each have a thickness of between 0.1 and 2 nm.

7. The multilayer structure according to claim 1, wherein each of said layers of alumina is formed of from 1 to 500 atomic monolayer(s) of alumina.

8. The multilayer structure according to claim 1, wherein each of said layers of silica is formed of from 1 to 500 atomic monolayer(s) of silica.

9. The multilayer structure according to claim 1, wherein said multilayer stack has a total thickness of between 5 and 50 nm.

10. The multilayer structure according to claim 1, wherein said multilayer stack has a silica/alumina mole ratio of between 1 and 99.

11. The multilayer structure according to claim 1, wherein said multilayer stack has a silica/alumina mole ratio of between 5 and 15.

12. A process for preparing the multilayer structure according to claim 1 comprising:
depositing the alternating layers of silica and alumina on the first face of the substrate so as to form said multilayer stack; and
depositing the catalytic layer on the second face of the multilayer stack.

13. The process according to claim 12, wherein said alternating layers of silica and of alumina of the multilayer stack are formed by an atomic layer deposition technique.

14. An assembly comprising the multilayer structure according to claim 1 coated with a mat of carbon nanotubes.

15. An assembly comprising the multilayer structure according to claim 1 coated with a mat of carbon nanotubes, wherein the assembly is provided by a process comprising:
(i) providing the multilayer structure according to claim 1; and
(ii) growing a mat of carbon nanotubes on the catalytic layer by a chemical vapor deposition technique.

16. The assembly according to claim 14, wherein the carbon nanotubes have a mean diameter of less than or equal to 13 nm.

17. The assembly according to claim 14, wherein the carbon nanotubes have a mean length of greater than or equal to 100 µm.

18. The assembly according to claim 14, wherein the carbon nanotubes have a mean length of between 100 and 600 µm.

19. A process for growing carbon nanotubes by chemical vapor deposition comprising:
providing the multilayer structure according to claim 1, and
growing a mat of carbon nanotubes on the catalytic layer by chemical vapor deposition, wherein the chemical vapor deposition is plasma-enhanced.

20. A process for growing a mat of carbon nanotubes, comprising:
(i) providing the multilayer structure according to claim 1; and
(ii) growing a mat of carbon nanotubes on the catalytic layer by a chemical vapour deposition technique.

21. The process according to claim 20 wherein the carbon nanotubes are grown by hot-filament chemical vapor deposition.

22. The process according to claim 21 wherein the hot-filament chemical vapor deposition uses a grid of hot filaments positioned above the catalytic layer.

23. The process according to claim 22, wherein the carbon nanotubes are grown under pressure conditions of less than or equal to 10 mbar and temperature conditions of less than or equal to 650° C.

24. The process according to claim 22, wherein carbon is variably provided to the catalytic layer during carbon nanotube growth in step (ii).

25. The process according to claim 22, wherein power of the hot filaments is varied during carbon nanotube growth in step (ii).

* * * * *